(12) United States Patent
Xian et al.

(10) Patent No.: US 11,306,411 B2
(45) Date of Patent: Apr. 19, 2022

(54) METHOD FOR GROWING LARGE-SIZE CRYSTAL BY LASER ASSISTED HEATING AND DEDICATED DEVICE

(71) Applicant: Institute of Metal Research, Chinese Academy of Sciences, Shenyang (CN)

(72) Inventors: Quangang Xian, Shenyang (CN); Zhongyuan Zhang, Shenyang (CN); Hao Jin, Shenyang (CN)

(*) Notice: Subject to any disclaimer, the term of this patent is extended or adjusted under 35 U.S.C. 154(b) by 119 days.

(21) Appl. No.: 16/644,460

(22) PCT Filed: May 16, 2019

(86) PCT No.: PCT/CN2019/000103
§ 371 (c)(1),
(2) Date: Mar. 4, 2020

(87) PCT Pub. No.: WO2019/223326
PCT Pub. Date: Nov. 28, 2019

(65) Prior Publication Data
US 2021/0062359 A1 Mar. 4, 2021

(30) Foreign Application Priority Data
May 23, 2018 (CN) .......................... 201810501253.5

(51) Int. Cl.
*C30B 13/22* (2006.01)
*C30B 29/16* (2006.01)
(Continued)

(52) U.S. Cl.
CPC .............. *C30B 13/22* (2013.01); *C30B 29/16* (2013.01); *C30B 29/20* (2013.01); *C30B 29/28* (2013.01); *C30B 29/52* (2013.01)

(58) Field of Classification Search
CPC ......... C30B 13/22; C30B 29/16; C30B 29/20; C30B 29/28; C30B 29/52
See application file for complete search history.

(56) References Cited

U.S. PATENT DOCUMENTS

| 8,778,225 B2* | 7/2014 | Shimamura | C01F 17/253 252/301.4 H |
| 2003/0211694 A1* | 11/2003 | Takei | H01L 29/66333 438/270 |

(Continued)

*Primary Examiner* — Robert M Kunemund
(74) *Attorney, Agent, or Firm* — Tsz Lung Yeung

(57) ABSTRACT

The object of the present invention is to provide a method for growing a large-size crystal by laser assisted heating and a dedicated device. The device comprises a laser core heating device, a xenon lamp surface heating device, a base, a vacuum cavity and etc. When a crystal is prepared, seeding and crystal growing are implemented by a xenon lamp-laser synergetic heating mode. According to the present invention, the structure and functions of the dedicated device are designed to introduce, at the center of a float melting zone, a laser heating source having high precision and strong controllability, so that a composite heating mode with xenon lamp surface heating and laser core heating is formed; and combined with the control of process, the method and the device solve the difficulty in growing a large-size test crystal bar and enable the growth of the crystal bar having a diameter up to 35 mm so as to facilitate engineering uses.

10 Claims, 2 Drawing Sheets

(51) Int. Cl.
   *C30B 29/20* (2006.01)
   *C30B 29/28* (2006.01)
   *C30B 29/52* (2006.01)

(56) References Cited

U.S. PATENT DOCUMENTS

2011/0192461 A1* 8/2011 Hendler ................ H01L 31/182
   136/258
2018/0274124 A1* 9/2018 Akutsu .................... H05B 6/32

* cited by examiner

METHOD FOR GROWING LARGE-SIZE CRYSTAL BY LASER ASSISTED HEATING AND DEDICATED DEVICE

BACKGROUND OF THE PRESENT INVENTION

Field of Invention

The present invention relates a method of preparing crystalline materials, and more particularly to a method for growing large-size crystals by a laser assisted heating and dedicated device.

Description of Related Arts

An optical floating zone furnace is a directional solidification furnace with suspended melting zone by using light and heat, wherein the optical floating zone furnace has the advantages of crucible free, high cleanliness, high temperature gradient, and rapid growth rate. It is widely used in research of crystal growth for intermetallic materials of oxide materials and TiAl, especially the crystalline materials with strong melting reaction and high melting point. The current application of the optical floating zone furnace is incorporated with 2 to 4 ellipsoidal mirrors for focusing optical heats from xenon lamps, wherein the melt is arranged to mainly maintain its shape by the surface tension and to grow in a vertical direction. For example, the optical floating zone furnace, model FZ-T-12000-X-VP-S made by Japanese CSC company, comprises 4 xenon lamps uniformly distributed, wherein its melting point can reach 3000° C., its temperature gradient is about 200° C., and the growth rate can be precisely adjusted in a range between 1 and 180 mm/h, and the protection shield can reach 99.9999% or above. Therefore, this optical floating zone furnace is considered as one of the most advanced furnaces in the world.

However, since the heating method of the optical floating zone furnace is implemented by light and heat, that is, the focal point of the xenon light sources are focused a surface of a test rod after focusing by the ellipsoidal mirrors, the test rod is gradually heated up from the surface thereof by means of thermal conductive in order to melt the test rod. In response to different materials of the test rod, when a diameter of the test rod is ≤15 mm, a center of the test rod can be melted thoroughly and the melted test rod can be stirred uniformly, and the floating molten zone is remained stable, for effective achieving the crystal growth. When the diameter of the test rod is greater than 15 mm, the test rod will be unevenly heated up that the surface temperature of the test rod is different from the core temperature thereof. In other words, the core of the test rod may not be completely melted and the floating molten zone cannot maintain stably, such that the crystal growth cannot be performed. The crystal growth method cannot be used for the structural configuration of the test rod having a larger diameter size. Therefore, the current furnace has a major drawback of incapable of growing large size crystals.

SUMMARY OF THE PRESENT INVENTION

In order to solve the problems of uneven heating, incomplete core melting, and unstable floating molten zone during the crystal growth process of a large-sized test rod (diameter >15 mm), the present invention provides a method for growing large-size crystals by a laser assisted heating and dedicated device. Through the novel structural and functional configurations of the device, a highly precise and controllable laser heat source is introduced to a center portion of the floating molten zone for surface heating by the xenon lamp and core heating by the laser as a composite heating method. Combining with the controlling process, the existing problem of crystal growth process of a large-sized test rod can be solved. Therefore, the present invention is able to grow a large-sized crystal with a diameter ≥30 mm, so as to enhance the engineering application.

In order to achieve the above objective, the present invention provides:

a laser assisted heating device for growing a large-size crystal, which comprises a laser core heating device 1, a xenon lamp surface heating device 2, a base 3, a vacuum cavity 4, wherein:

the laser core heating device 1 comprises a laser focusing lens 11, a lens supporting frame 12, an upper support shaft 13, and an optical fiber 15, wherein the laser focusing lens 11 is mounted on the lens supporting frame 12 and is connected to the laser generator 18 via the optical fiber 15, wherein the upper support shaft 13 having a hollow structure coupled at a bottom side of the lens supporting frame 12 via a flange and a sealing sleeve 16, wherein a lens is provided between the upper support shaft 12 and the laser focusing lens 11 for enabling a laser beam passing through and providing a sealing effect;

a feed rod 33, having a hollow structure, suspended and supported at a lower end of the upper support shaft 13, wherein a seed crystal rod 34 is located below the feed rod 33 and is coupled at a lower support shaft 35, wherein the lower support shaft 35 is coupled on the base 3, wherein a space between the feed rod 33 and the seed crystal rod 34 forms a floating molten zone 36;

the xenon lamp surface heating device 2 comprises a xenon lamp 21, an ellipsoidal reflector 22, and a xenon lamp retainer 23, wherein the xenon lamp retainer 23 is located between the lens supporting frame 12 and the base 3, wherein the xenon lamp retainer 23 is arrange to retain the xenon lamp 21 and the ellipsoidal reflector 22 in position between the lens supporting frame 12 and the base 3, wherein the xenon lamp 21 is located at a concave side of the ellipsoidal reflector 22 to directly face toward the feed rod 33;

the vacuum cavity 4 has an upper vacuum chamber 41, a quartz tube 42 and a lower vacuum chamber 42, wherein the quartz tube 42 is affixed between the upper vacuum chamber 41 and the lower vacuum chamber 42 (the upper vacuum chamber 41 is located between the lens supporting frame 12 and the xenon lamp retainer 23, the quartz tube 42 is located between the xenon lamp retainer 23 and the base 3, and the lower vacuum chamber 43 is located below the base 3), wherein the upper vacuum cavity 41, the quartz tube 42 and the lower vacuum cavity 43 are communicated with each other through a flange and a vacuum rubber ring to form the vacuum cavity 4, wherein the lower end of the upper support shaft 13, the feed rod 33, the seed crystal rod 34 and the upper end of the lower support shaft 35 are disposed in an interior of the quartz tube 42.

According to the preferred embodiment:

An inner diameter of the upper support shaft 13 is about 12-15 mm, an outer diameter of the upper support shaft 13 is about 20 mm, an inner diameter of the feed rod 33 is about 12-15 mm, and an outer diameter of the feed rod 33 is about 32-35 mm.

At least an adjusting device 17 is provide at the bottom side of the lens supporting frame 12 for adjusting a height of the lens supporting frame 12 and an angle thereof with respect to a horizontal direction.

The upper support shaft 13, the feed rod 33, the seed crystal rod 34 and the lower support shaft 35 are coaxially aligned with each other.

An exhaust pipe having an exhaust valve 31 is provided at the upper vacuum chamber 41 and an intake pipe having an intake valve 32 is provided at the lower vacuum chamber 43.

An air-cooled or water-cooled connector is provided at the laser focusing lens 11.

The upper support shaft 13 and the lower support shaft 35 are rotatable via one or more rotation devices, wherein the upper support shaft 13 and the lower support shaft 35 are arranged for driving the feed rod 33 and the seed crystal rod 34 to rotate respectively, wherein the upper support shaft 13 is connected to a lifting device for controllably lifting up and dropping down the upper support shaft 13.

The number of xenon lamps 21 matches with the number of ellipsoidal reflectors 22, wherein there are 2-6 xenon lamps 21 and ellipsoidal reflectors 22 correspondingly, wherein the xenon lamps 21 and the ellipsoidal reflectors 22 are evenly distributed that the feed rod 33 is encircled by the xenon lamps 21 and the ellipsoidal reflectors 22.

The present invention further provides a method of growing a large-size crystal by a laser assisted heating device which comprises a xenon lamp and laser generator to generate a composite heat configuration for crystal growth, wherein the method comprises the following steps.

(1) Prepare the feed rod 33 and the seed crystal rod 34 according to the composition and size requirements thereof, and securely couple the feed rod 33 and the seed crystal rod 34 at the upper support shaft 13 and the lower support shaft 35 respectively.

(2) Adjust the laser generator 18, the optical fiber 15 and the laser focusing lens 11 to ensure the laser beam being focused to form a parallel beam of Φ3-Φ5 mm after the laser beam is reflected by the laser focusing lens 11, and ensure the parallel beam being coaxially aligned with a center through slot of the upper support shaft 13 and a center through slot of the feed rod 33.

(3) Evacuate the vacuum cavity 4 until a vacuum pressure in the vacuum cavity reaches $10^{-3}$ Pa, and then open up the intake valve 32 and the exhaust valve 31 to introduce argon gas (2 L/min) into the vacuum cavity 4.

(4) Actuate the lifting device and the rotation device, and configure a lifting speed and the rotational speed thereof.

(5) Switch on the xenon lamp 21 and the laser generator 18 to heat up the feed rod 33. Alternatively, switch on the xenon lamp 21 firstly to heat up a surface of the feed rod 33 and then switch on the laser generator 18 to heat up the feed rod 33 after a floating molten zone 36 is established.

(6) Finally, from the crystal.

According to the preferred embodiment:

In the step (4), the rotational speed of each of the feed rod 33 and the seed crystal rod 34 is about 0-30 r/min, wherein a rotational direction of the feed rod 33 can be the same or different from a rotational direction of the seed crystal rode 34, wherein the rotational speed of the feed rod 33 can be the same or different from the rotational speed of the seed crystal rode 34.

In the step (5), the xenon lamp 21 is firstly switched on for surface heating the feed rod 33 for 2-5 min, the laser generator 18 is then switched on for heating up the feed rod 33 to grow a better quality crystal. The power of xenon lamp is about 1.0-5.0 kW, and the heating power of the laser generator 18 is gradually and adjustably increased from 0 W to 0.1-1.0 kW at a rate of 5-10 W/min.

In the step (6), the larges-sized crystal with a diameter ≥15 mm is prepared. Preferably, the larges-sized crystal with a diameter ≥30 mm is prepared.

According to the preferred embodiment, by incorporating the laser core heating device, the hollow upper support shaft, and hollow feed rod at the same time, the focused laser beam is guided to pass through the interior of the upper support shaft and the interior of the feed rod and to project from the top of the floating molten zone to a center thereof, such that a synergetic heating configuration is obtained by surface heating the feed rod via the xenon lamp and core heating the feed rod via the laser beam from a top end of the feed rod. At the same time, combining with the controlling process, the surface heating and the core heating of the feed rod in the floating molten zone are more uniformly and evenly to stably grow the crystal in the molten zone. The temperature gradient is further increased, and the solid-liquid interface is improved, so as to increase the success rate of seeding and growing a large-sized crystal with a better quality. Accordingly, the present invention is able to prepare and grow a high performance crystal with a diameter of 35 mm, so as to solve the existing problem of growing a large-sized test rod (diameter ≥30 mm) crystal.

Figure 1:
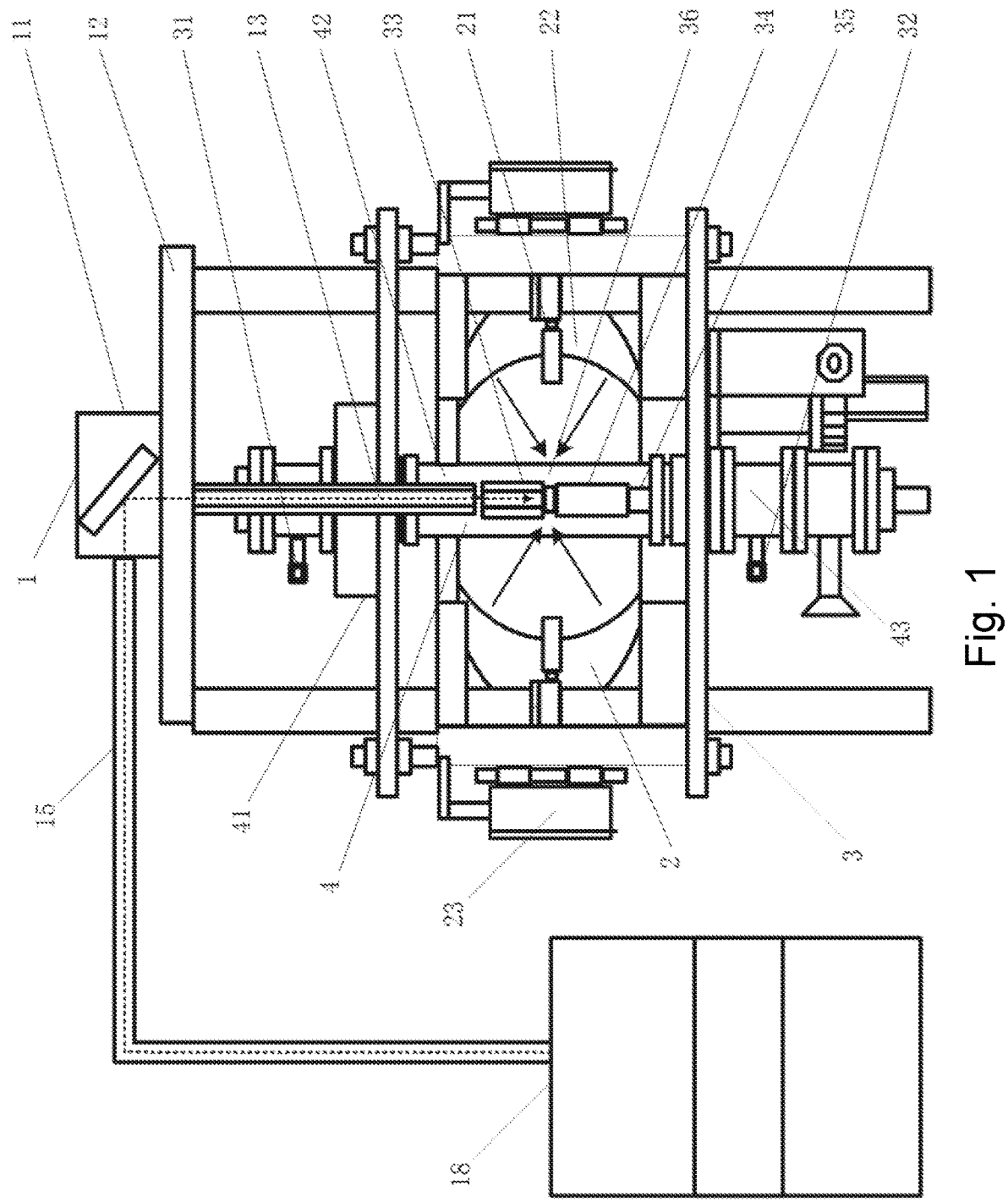
FIG. 1 is a schematic view of a laser assisted heating device for growing large-size crystals according to a preferred embodiment of the present invention.

Reference characters: 1—laser core heating device, 2—xenon lamp surface heating device, 3—base, 4—vacuum cavity, 11—laser focusing lens, 12—lens supporting frame, 13—upper support shaft, 15—optical fiber, 16—sealing sleeve, 17—adjusting device, 18—laser generator, 21—xenon lamp, 22—ellipsoidal reflector, 23—xenon lamp retainer, 31—exhaust valve, 32—intake valve, 33—feed rod, 34—seed crystal rod, 35—lower support shaft, 36—floating molten zone, 41—upper vacuum chamber, 42—quartz tube, 43—lower vacuum chamber

DETAILED DESCRIPTION OF THE PREFERRED EMBODIMENT

As shown in FIG. 1, a laser assisted heating device for growing large-size crystals according to a preferred embodiment is illustrated, wherein the device comprises a laser core heating device 1, a xenon lamp surface heating device 2, a base 3, a vacuum cavity 4, wherein:

The laser core heating device 1 comprises a laser focusing lens 11, a lens supporting frame 12, an upper support shaft 13, and an optical fiber 15. The laser focusing lens 11 is mounted on the lens supporting frame 12 and is connected to the laser generator 18 via the optical fiber 15. The position and angle of the laser focusing lens 11 in the horizontal and vertical directions are adjustable. The upper support shaft 13 has a hollow structure (an inner diameter is 12 mm and an outer diameter is 20 mm), wherein the upper support shaft 13 is coupled at a bottom side of the lens supporting frame 12 via a flange and a sealing sleeve 16. A lens is provided between the upper support shaft 12 and the laser focusing lens 11, wherein the lens is sealed by the sealing sleeve 16. The lens has a function of maintaining the vacuum cavity 4 in a vacuum condition and, at the same time, enabling a laser light passing through the upper support shaft 13 to a center of a floating molten zone 36.

A feed rod 33 has a hollow structure (an inner diameter is 15 mm and an outer diameter is 32 mm), wherein the feed rod 33 is suspended and supported at a lower end of the upper support shaft 13. During an assembling of the feed rod 33, the feed rod 33 must be coaxially aligned with the upper support shaft 13 to precisely and coaxially align a center through slot of the feed rod 33 with a center through slot of the upper support shaft 13 to form an optical channel for the laser passing therethrough. A seed crystal rod 34 is located below the feed rod 33 and is coupled at a lower support shaft 35, wherein the lower support shaft 35 is coupled on the base 3. A space between the feed rod 33 and the seed crystal rod 34 forms the floating molten zone 35.

The xenon lamp surface heating device 2 comprises a xenon lamp 21, an ellipsoidal reflector 22 such as an ellipsoidal mirror, and a xenon lamp retainer 23. The xenon lamp retainer 23 is located between the lens supporting frame 12 and the base 3, wherein the xenon lamp retainer 23 is arrange to retain the xenon lamp 21 and the ellipsoidal reflector 22 in position between the lens supporting frame 12 and the base 3. The xenon lamp 21 is supported on a concave side of the ellipsoidal reflector 22. The feed rod 33 is located at a focal point of the ellipsoidal reflector 22. In this embodiment, four xenon lamps 21 and four ellipsoidal reflectors 22 are evenly distributed that the feed rod 33 is encircled by the xenon lamps 21 and the ellipsoidal reflectors 22.

The vacuum cavity 4 has an upper vacuum chamber 41, a quartz tube 42 and a lower vacuum chamber 42. The upper vacuum cavity 41 is located between the lens supporting frame 12 and the xenon lamp retainer 23. The quartz tube 42 is located between the xenon lamp retainer 23 and the base 3. The lower vacuum cavity 43 is located below the base 3. The upper vacuum cavity 41, the quartz tube 42 and the lower vacuum cavity 43 are communicated with each other through a flange and a vacuum rubber ring to form the vacuum cavity 4. The lower end of the upper support shaft 13, the feed rod 33, the seed crystal rod 34 and the upper end of the lower support shaft 35 are coaxially aligned with each other and are disposed in an interior of the quartz tube 42. An exhaust pipe having an exhaust valve 31 is provided at the upper vacuum chamber 41 and an intake pipe having an intake valve 32 is provided at the lower vacuum chamber 43.

The upper support shaft 13 and the lower support shaft 35 are rotatable by connecting to one or more rotation devices, wherein the upper support shaft 13 and the lower support shaft 35 are arranged for driving the feed rod 33 and the seed crystal rod 34 to rotate respectively. The upper support shaft 13 is connected to a lifting device for controllably lifting up and dropping down the upper support shaft 13.

The crystal is prepared by the following steps:

(1) Prepare the feed rod 33 and the seed crystal rod 34 according to the composition and size requirements thereof, and securely couple the feed rod 33 and the seed crystal rod 34 at the upper support shaft 13 and the lower support shaft 35 respectively.

(2) Adjust the laser generator 18, the optical fiber 15 and the laser focusing lens 11 to ensure the laser beam being focused to form a parallel beam of Φ3-Φ5 mm after the laser beam is reflected by the laser focusing lens 11, and ensure the parallel beam being coaxially aligned with the center through slot of the upper support shaft 13 and the center through slot of the feed rod 33.

(3) Evacuate the vacuum cavity 4 until a vacuum pressure in the vacuum cavity reaches $10^{-3}$ Pa, and then open up the intake valve 32 and the exhaust valve 31 to introduce argon gas (2 L/min) into the vacuum cavity 4.

(4) Actuate the lifting device and the rotation device, and configure a lifting speed and the rotational speed thereof.

(5) Switch on the xenon lamp 21 and the laser generator 18 to heat up the feed rod 33. Alternatively, switch on the xenon lamp 21 firstly to heat up a surface of the feed rod 33 and then switch on the laser generator 18 to heat up the feed rod 33 after the floating molten zone 36 is established.

(6) Finally from the crystal.

Example 1

Prepare a directional TiNb crystal with a diameter of 30 mm.

Grown rate: 6 mm/h, rotational speed of the feed rod 33: 10 r/min, power of xenon lamp: 1.5 kW (external heating), laser power: 0.2 kW (core heating). After switching on the xenon lamp for heat generation for 5 minutes, laser is then generated for further heating. The heating power of laser is gradually and adjustably increased from 0 W to 0.2 kW at a rate of 5 W/min, such that the heats are cooperatively applied by the xenon lamp and the laser generator. Finally, the larges-sized TiNb crystal with a diameter of 30 mm is prepared.

Example 2

Prepare a directional NbSi crystal with a diameter of 30 mm.

Grown rate: 7 mm/h, rotational speed of the feed rod 33: 3 r/min, power of xenon lamp: 2.5 kW (external heating), laser power: 0.5 kW (core heating). After switching on the xenon lamp for heat generation for 8 minutes, laser is then generated for further heating. The heating power of laser is gradually and adjustably increased from 0 W to 0.5 kW at a rate of 6 W/min, such that the heats are cooperatively applied by the xenon lamp and the laser generator. Finally, the larges-sized NbSi crystal with a diameter of 30 mm is prepared.

Example 3

Prepare a directional $Al_2O_3$/YAG crystal with a diameter of 30 mm.

Grown rate: 10 mm/h, rotational speed of the feed rod 33: 15 r/min, power of xenon lamp: 2.0 kW (external heating), laser power: 0.3 kW (core heating). After switching on the xenon lamp for heat generation for 5 minutes, laser is then generated for further heating. The heating power of laser is gradually and adjustably increased from 0 W to 0.3 kW at a rate of 5 W/min, such that the heats are cooperatively applied by the xenon lamp and the laser generator. Finally, the larges-sized $Al_2O_3$/YAG crystal with a diameter of 30 mm is prepared.

Example 4

Prepare a directional GaO crystal with a diameter of 30 mm.

Grown rate: 5 mm/h, rotational speed of the feed rod 33: 12 r/min, power of xenon lamp: 1.0 kW (external heating), laser power: 0.1 kW (core heating). After switching on the xenon lamp for heat generation for 3 minutes, laser is then generated for further heating. The heating power of laser is gradually and adjustably increased from 0 W to 0.1 kW at a rate of 5 W/min, such that the heats are cooperatively applied by the xenon lamp and the laser generator. Finally, the larges-sized GaO crystal with a diameter of 30 mm is prepared.

Example 5

Prepare a directional Ni—Fe—Ga crystal with a diameter of 30 mm.

Grown rate: 15 mm/h, rotational speed of the feed rod 33: 20 r/min, power of xenon lamp: 3.0 kW (external heating), laser power: 0.6 kW (core heating). After switching on the xenon lamp for heat generation for 6 minutes, laser is then generated for further heating. The heating power of laser is gradually and adjustably increased from 0 W to 0.6 kW at a rate of 6 W/min, such that the heats are cooperatively applied by the xenon lamp and the laser generator. Finally, the larges-sized Ni—Fe—Ga crystal with a diameter of 30 mm is prepared.

Example 6

Prepare a directional TiAl crystal with a diameter of 30 mm.

Grown rate: 5 mm/h, rotational speed of the feed rod 33: 9 r/min, power of xenon lamp: 2.0 kW (external heating), laser power: 0.2 kW (core heating). After switching on the xenon lamp for heat generation for 5 minutes, laser is then generated for further heating. The heating power of laser is gradually and adjustably increased from 0 W to 0.2 kW at a rate of 5 W/min, such that the heats are cooperatively applied by the xenon lamp and the laser generator. Finally, the larges-sized TiAl crystal with a diameter of 30 mm is prepared.

Example 7

Prepare a directional TiAlNb crystal with a diameter of 30 mm.

Grown rate: 15 mm/h, rotational speed of the feed rod 33: 12 r/min, power of xenon lamp: 6.0 kW (external heating), laser power: 0.6 kW (core heating). After switching on the xenon lamp for heat generation for 6 minutes, laser is then generated for further heating. The heating power of laser is gradually and adjustably increased from 0 W to 0.6 kW at a rate of 6 W/min, such that the heats are cooperatively applied by the xenon lamp and the laser generator. Finally, the larges-sized TiAlNb crystal with a diameter of 30 mm is prepared.

Example 8

Prepare a directional $Al_2O_3$ crystal with a diameter of 30 mm.

Grown rate: 20 mm/h, rotational speed of the feed rod 33: 25 r/min, power of xenon lamp: 3.0 kW (external heating), laser power: 0.5 kW (core heating). After switching on the xenon lamp for heat generation for 6 minutes, laser is then generated for further heating. The heating power of laser is gradually and adjustably increased from 0 W to 0.6 kW at a rate of 6 W/min, such that the heats are cooperatively applied by the xenon lamp and the laser generator. Finally, the larges-sized $Al_2O_3$ crystal with a diameter of 30 mm is prepared.

Example 9

Figure 2:
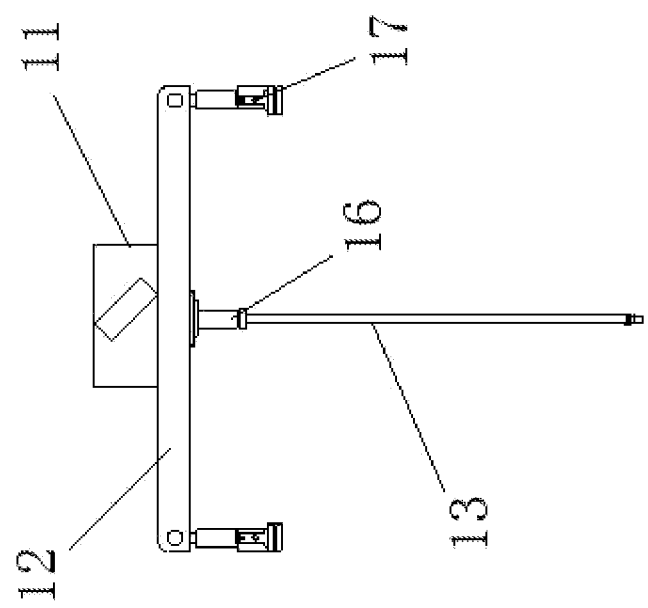
FIG. 2 is a perspective view of a laser core heating device according to the above preferred embodiment of the present invention.

The difference between this example and the example 1 is that, as shown in FIG. 2, at least an adjusting device 17 is provide at the bottom side of the lens supporting frame 12. By adjusting a height of the lens supporting frame 12 and an angle thereof with respect to a horizontal direction, the laser beam can smoothly reach the center of the floating molten zone 36. The result in this example is the same as the result in the example 1. Finally, the large-sized TiNb crystal with a diameter of 30 mm is prepared.

Example 10

The difference between this example and the example 1 is that an air-cooled connector is provided at the laser focusing lens 11 for generating a cooling effect therefor. The result in this example is the same as the result in the example 1. Finally, the large-sized TiNb crystal with a diameter of 30 mm is prepared.

Example 11

The difference between this example and the example 1 is that two xenon lamps 21 and two ellipsoidal reflectors 22 are provided and are symmetrically arranged with respect to the feed rod 33. The result in this example is the same as the result in the example 1. Finally, the large-sized TiNb crystal with a diameter of 30 mm is prepared.

Example 12

Prepare a directional TiNb crystal with a diameter of 35 mm.

Grown rate: 6 mm/h, rotational speed of the feed rod 33: 10 r/min, power of xenon lamp: 1.9 kW (external heating), laser power: 0.29 kW (core heating). After switching on the xenon lamp for heat generation for 8 minutes, laser is then generated for further heating. The heating power of laser is gradually and adjustably increased from 0 W to 0.29 kW at a rate of 5 W/min, such that the heats are cooperatively applied by the xenon lamp and the laser generator. Finally, the larges-sized TiNb crystal with a diameter of 35 mm is prepared.

Example 13

Prepare a directional TiAl crystal with a diameter of 35 mm.

Grown rate: 5 mm/h, rotational speed of the feed rod 33: 9 r/min, power of xenon lamp: 2.5 kW (external heating), laser power: 0.26 kW (core heating). After switching on the xenon lamp for heat generation for 5 minutes, laser is then generated for further heating. The heating power of laser is gradually and adjustably increased from 0 W to 0.26 kW at a rate of 5 W/min, such that the heats are cooperatively applied by the xenon lamp and the laser generator. Finally, the larges-sized TiAl crystal with a diameter of 35 mm is prepared.

Example 14

Prepare a directional TiAlNb crystal with a diameter of 35 mm.

Grown rate: 15 mm/h, rotational speed of the feed rod 33: 12 r/min, power of xenon lamp: 8 kW (external heating), laser power: 0.65 kW (core heating). After switching on the xenon lamp for heat generation for 8 minutes, laser is then generated for further heating. The heating power of laser is gradually and adjustably increased from 0 W to 0.65 kW at a rate of 5 W/min, such that the heats are cooperatively applied by the xenon lamp and the laser generator. Finally, the larges-sized TiAlNb crystal with a diameter of 35 mm is prepared.

Example 15

Prepare a directional $Al_2O_3/YAG$ crystal with a diameter of 35 mm.

Grown rate: 10 mm/h, rotational speed of the feed rod 33: 15 r/min, power of xenon lamp: 2.5 kW (external heating), laser power: 0.35 kW (core heating). After switching on the xenon lamp for heat generation for 3 minutes, laser is then generated for further heating. The heating power of laser is gradually and adjustably increased from 0 W to 0.35 kW at a rate of 5 W/min, such that the heats are cooperatively applied by the xenon lamp and the laser generator. Finally, the larges-sized $Al_2O_3/YAG$ crystal with a diameter of 35 mm is prepared.

Example 16

Prepare a directional $Al_2O_3$ crystal with a diameter of 35 mm.

Grown rate: 20 mm/h, rotational speed of the feed rod 33: 25 r/min, power of xenon lamp: 3.5 kW (external heating), laser power: 0.55 kW (core heating). After switching on the xenon lamp for heat generation for 5 minutes, laser is then generated for further heating. The heating power of laser is gradually and adjustably increased from 0 W to 0.55 kW at a rate of 5 W/min, such that the heats are cooperatively applied by the xenon lamp and the laser generator. Finally, the larges-sized $Al_2O_3$ crystal with a diameter of 35 mm is prepared.

Example 17

Prepare a directional $Al_2O_3/ZrO_2$ crystal with a diameter of 35 mm.

Grown rate: 10 mm/h, rotational speed of the feed rod 33: 15 r/min, power of xenon lamp: 1.2 kW (external heating), laser power: 0.25 kW (core heating). After switching on the xenon lamp for heat generation for 5 minutes, laser is then generated for further heating. The heating power of laser is gradually and adjustably increased from 0 W to 0.25 kW at a rate of 5 W/min, such that the heats are cooperatively applied by the xenon lamp and the laser generator. Finally, the larges-sized $Al_2O_3/ZrO_2$ crystal with a diameter of 35 mm is prepared.

Example 18

Prepare a directional $Al_2O_3/Y_2O_3$ crystal with a diameter of 35 mm.

Grown rate: 20 mm/h, rotational speed of the feed rod 33: 15 r/min, power of xenon lamp: 1.3 kW (external heating), laser power: 0.23 kW (core heating). After switching on the xenon lamp for heat generation for 5 minutes, laser is then generated for further heating. The heating power of laser is gradually and adjustably increased from 0 W to 0.23 kW at a rate of 5 W/min, such that the heats are cooperatively applied by the xenon lamp and the laser generator. Finally, the larges-sized $Al_2O_3/Y_2O_3$ crystal with a diameter of 35 mm is prepared.

Example 19

Prepare a directional NiFeGaCo crystal with a diameter of 35 mm.

Grown rate: 5 mm/h, rotational speed of the feed rod 33: 15 r/min, power of xenon lamp: 1.0 kW (external heating), laser power: 0.15 kW (core heating). After switching on the xenon lamp for heat generation for 3 minutes, laser is then generated for further heating. The heating power of laser is gradually and adjustably increased from 0 W to 0.15 kW at a rate of 5 W/min, such that the heats are cooperatively applied by the xenon lamp and the laser generator. Finally, the larges-sized NiFeGaCo crystal with a diameter of 35 mm is prepared.

Example 20

Prepare a directional $Al_2O_3/Sn_2O_3$ crystal with a diameter of 35 mm.

Grown rate: 9 mm/h, rotational speed of the feed rod 33: 10 r/min, power of xenon lamp: 1.0 kW (external heating), laser power: 0.15 kW (core heating). After switching on the xenon lamp for heat generation for 8 minutes, laser is then generated for further heating. The heating power of laser is gradually and adjustably increased from 0 W to 0.15 kW at a rate of 5 W/min, such that the heats are cooperatively applied by the xenon lamp and the laser generator. Finally, the larges-sized $Al_2O_3/Sn_2O_3$ crystal with a diameter of 35 mm is prepared.

The above description is only the preferred embodiment of the present invention, and is not intended to be limiting. The present invention should include all modifications, equivalent substitutions and improvements made within the spirit and principles of the present invention.

In addition, the descriptions of existing structures and techniques are omitted herein to avoid unnecessary confusion for the concepts of the present invention.

What is claimed is:

1. A laser assisted heating device for growing a large-size crystal, characterized in that: the device comprises a laser core heating device, a xenon lamp surface heating device, a base, a vacuum cavity, wherein:

the laser core heating device comprises a laser focusing lens, a lens supporting frame, an upper support shaft, and an optical fiber, wherein the laser focusing lens is mounted on the lens supporting frame and is connected to the laser generator via the optical fiber, wherein the upper support shaft having a hollow structure coupled at a bottom side of the lens supporting frame via a flange and a sealing sleeve, wherein a lens is provided between the upper support shaft and the laser focusing lens;

a feed rod, having a hollow structure, suspended and supported at a lower end of the upper support shaft, wherein a seed crystal rod is located below the feed rod and is coupled at a lower support shaft, wherein the lower support shaft is coupled on the base, wherein a space between the feed rod and the seed crystal rod forms a floating molten zone;

the xenon lamp surface heating device comprises a xenon lamp, an ellipsoidal reflector, and a xenon lamp retainer, wherein the xenon lamp retainer is located between the lens supporting frame and the base, wherein the xenon lamp retainer is arrange to retain the xenon lamp and the ellipsoidal reflector in position between the lens supporting frame and the base, wherein the xenon lamp is located at a concave side of the ellipsoidal reflector to directly face toward the feed rod;

the vacuum cavity has an upper vacuum chamber, a quartz tube and a lower vacuum chamber, wherein the quartz tube is affixed between the upper vacuum chamber and the lower vacuum chamber (the upper vacuum chamber is located between the lens supporting frame and the xenon lamp retainer, the quartz tube is located between the xenon lamp retainer and the base, and the lower vacuum chamber is located below the base, wherein the upper vacuum cavity, the quartz tube and the lower vacuum cavity are communicated with each other through a flange and a vacuum rubber ring to form the vacuum cavity, wherein the lower end of the upper support shaft, the feed rod, the seed crystal rod and the upper end of the lower support shaft are disposed in an interior of the quartz tube.

2. The laser assisted heating device for growing a large-size crystal according to claim 1, characterized in that: an inner diameter of the upper support shaft is 12-15 mm, an outer diameter of the upper support shaft is 20 mm, an inner diameter of the feed rod is 12-15 mm, and an outer diameter of the feed rod is 32-35 mm.

3. The laser assisted heating device for growing a large-size crystal according to claim 1, characterized in that: an adjusting device is provide at the bottom side of the lens supporting frame for adjusting a height of the lens supporting frame and an angle thereof with respect to a horizontal direction.

4. The laser assisted heating device for growing a large-size crystal according to claim 1, characterized in that: the upper support shaft and the lower support shaft are rotatable via one or more rotation devices, wherein the upper support shaft and the lower support shaft are arranged for driving the feed rod and the seed crystal rod to rotate respectively, wherein the upper support shaft is connected to a lifting device for controllably lifting up and dropping down the upper support shaft.

5. The laser assisted heating device for growing a large-size crystal according to claim 1, characterized in that: an exhaust pipe having an exhaust valve is provided at the upper vacuum chamber and an intake pipe having an intake valve is provided at the lower vacuum chamber.

6. A method of growing a large-size crystal by using the device according to claim 1, characterized in that: using a laser assisted heating device for growing a large-size crystal, and employing xenon light and laser for cooperative heating configuration to induce crystal growth.

7. The method of growing a large-size crystal according to claim 6, characterized in that: comprising the steps of:

(1) preparing the feed rod and the seed crystal rod according to the composition and size requirements thereof, and securely couple the feed rod and the seed crystal rod at the upper support shaft and the lower support shaft respectively;

(2) adjusting the laser generator, the optical fiber and the laser focusing lens to ensure the laser beam being focused to form a parallel beam of Φ3-Φ5 mm after the laser beam is reflected by the laser focusing lens, and ensure the parallel beam being coaxially aligned with a center through slot of the upper support shaft and a center through slot of the feed rod;

(3) evacuating the vacuum cavity until a vacuum pressure in the vacuum cavity reaches $10^{-3}$ Pa, and then open up the intake valve and the exhaust valve to introduce argon gas (2 L/min) into the vacuum cavity;

(4) actuating the lifting device and the rotation device, and configure a lifting speed and the rotational speed thereof;

(5) switching on the xenon lamp and the laser generator to heat up the feed rod, alternatively, switching on the xenon lamp firstly to heat up a surface of the feed rod and then switching on the laser generator to heat up the feed rod after a floating molten zone is established; and (6) finally forming the crystal.

8. The method of growing a large-size crystal according to claim 7, characterized in that: in the step (4), the rotational speed of each of the feed rod and the seed crystal rod is about 0-30 r/min, wherein a rotational direction of the feed rod is the same or different from a rotational direction of the seed crystal rod, wherein the rotational speed of the feed rod is the same or different from the rotational speed of the seed crystal rod.

9. The method of growing a large-size crystal according to claim 7, characterized in that: in the step (5), the xenon lamp is firstly switched on for surface heating the feed rod for 2-5 min, the laser generator is then switched on for heating up the feed rod to grow a better quality crystal, wherein a power of xenon lamp is 1.0-5.0 kW, and a heating power of the laser generator is gradually and adjustably increased from 0 W to 0.1-1.0 kW at a rate of 5-10 W/min.

10. The method of growing a large-size crystal according to claim 6, characterized in that: in the step (6), the larges-sized crystal with a diameter ≥30 mm is prepared.

* * * * *